United States Patent [19]
Heinrich

[11] Patent Number: 5,929,735
[45] Date of Patent: *Jul. 27, 1999

[54] APPARATUS FOR FACILITATING MOUNTING OF AN INDUCTOR ASSEMBLY TO A PRINTED CIRCUIT BOARD

[76] Inventor: Andrew L. Heinrich, 1219 W. Sycamore St., Chillicothe, Ill. 61523

[*] Notice: This patent is subject to a terminal disclaimer.

[21] Appl. No.: 08/994,306
[22] Filed: Dec. 19, 1997
[51] Int. Cl.⁶ .............................. H01F 27/08; H01F 15/02
[52] U.S. Cl. ................................ 336/61; 336/65; 336/229
[58] Field of Search ............................... 336/61, 65, 229, 336/67, 68, 197

[56] References Cited

U.S. PATENT DOCUMENTS 3,905,000  9/1975  Walter ........................................ 336/65
4,754,250  6/1988  Duin .......................................... 336/65
5,670,924  9/1997  Heinrich ..................................... 336/61

Primary Examiner—Thomas J. Kozma
Attorney, Agent, or Firm—Mario J. Donato, Jr.; Byron G. Buck

[57] ABSTRACT

An apparatus for facilitating mounting of an inductor assembly to a printed circuit board that is easy to assemble into any mounting scheme and which assures that an adequate clamping force to overcome vibration forces is provided. The apparatus includes an inductor assembly, a spacer assembly adapted to receive the inductor assembly, a wedge member for engaging one side of the inductor assembly and for distributing a clamping force substantially evenly about the inductor assembly, and a bushing disposed through each of the inductor assembly, the spacer assembly, and the wedge member, such that when a clamping force is applied to the wedge member, the inductor assembly is clamped to the spacer assembly.

3 Claims, 2 Drawing Sheets

APPARATUS FOR FACILITATING MOUNTING OF AN INDUCTOR ASSEMBLY TO A PRINTED CIRCUIT BOARD

TECHNICAL FIELD

This invention relates generally to an apparatus for facilitating mounting of an inductor assembly to a printed circuit board, and more particularly, to an apparatus for facilitating mounting of an inductor assembly to a printed circuit board that is easy to assemble into any mounting scheme and which assures that an adequate clamping force to overcome vibration forces is provided.

BACKGROUND ART

Typically, inductor designs are customized to meet individual electrical design characteristics that determine overall shape and size. Voltage supply features may vary from design to design, but in all instances the manufacturing tolerances are difficult to control. Parts typically have dimensional tolerances of ±2 millimeters or more on all features. This shape variation presents a problem with respect to packaging the part into an electronic control module, in that the electronic control module must survive the environment that it is mounted in, which in engines typically includes high temperatures and high vibration forces. A part with large feature variation is difficult to assemble into any mounting scheme and ensure that an adequate clamping force to overcome vibration forces is provided.

The present invention is directed to overcoming one or more of the problems set forth above.

SUMMARY OF THE INVENTION

The present invention avoids the disadvantages of known inductor mounting assemblies and provides an apparatus for facilitating mounting of an inductor assembly to a printed circuit board that overcomes the inductor shape variation and provides adequate clamping force to overcome substantial vibration forces. In one aspect of the present invention, an apparatus for facilitating mounting of an inductor assembly to a printed circuit board is provided. The apparatus includes an inductor assembly, a spacer assembly adapted to receive the inductor assembly, a wedge member for engaging one side of the inductor assembly and for distributing a clamping force substantially evenly about the inductor assembly, and a bushing disposed through each of the inductor assembly, the spacer assembly, and the wedge member, such that when a clamping force is applied to the wedge member, the inductor assembly is clamped to the spacer assembly.

These and other aspects and advantages of the present invention will become apparent upon reading the detailed description of the preferred embodiment in connection with the drawings and appended claims.

BRIEF DESCRIPTION OF THE DRAWINGS

For a better understanding of the subject invention, reference may be made to the accompanying drawings, in which.

DESCRIPTION OF A PREFERRED EMBODIMENT OF THE INVENTION

Figure 1:
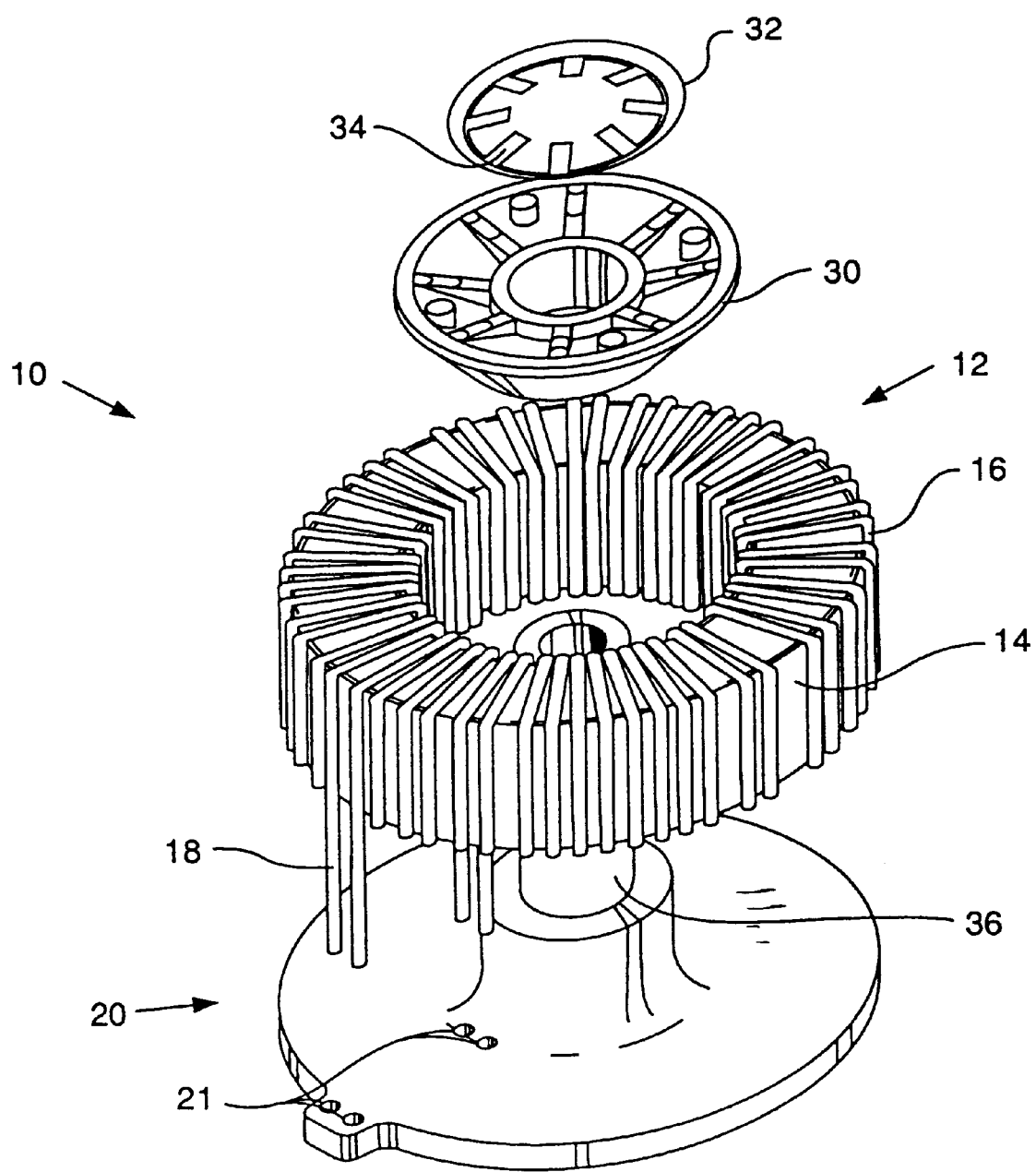
FIG. 1 is an exploded isometric view of an apparatus for facilitating mounting of an inductor assembly to a printed circuit board.

Referring now to the drawings, an apparatus for facilitating mounting of an inductor assembly to a printed circuit board 10 is shown generally in FIG. 1. In the preferred embodiment, the apparatus 10 comprises an inductor assembly 12 having a centrally disposed aperture therein. As seen in FIG. 1, inductor assembly 12 comprises a toroid shaped core 14 of magnetic material having metal windings 16 about the surface thereof. Windings 16 are typically automatically wound; however, as is known in the art, the overall thickness and diameter of inductor assembly 12 may vary because of the dimensional tolerances of the parts (e.g. core and windings). In the preferred embodiment, windings 16 form lead wires 18 for electrically connecting inductor assembly 12 to printed circuit board 38. However, it is contemplated that separate lead wires may be connected between windings 16 and printed circuit board 38 such as by soldering or the like, thereby electrically connecting inductor assembly 12 to printed circuit board 38, without departing from the scope of the present invention.

Figure 2:
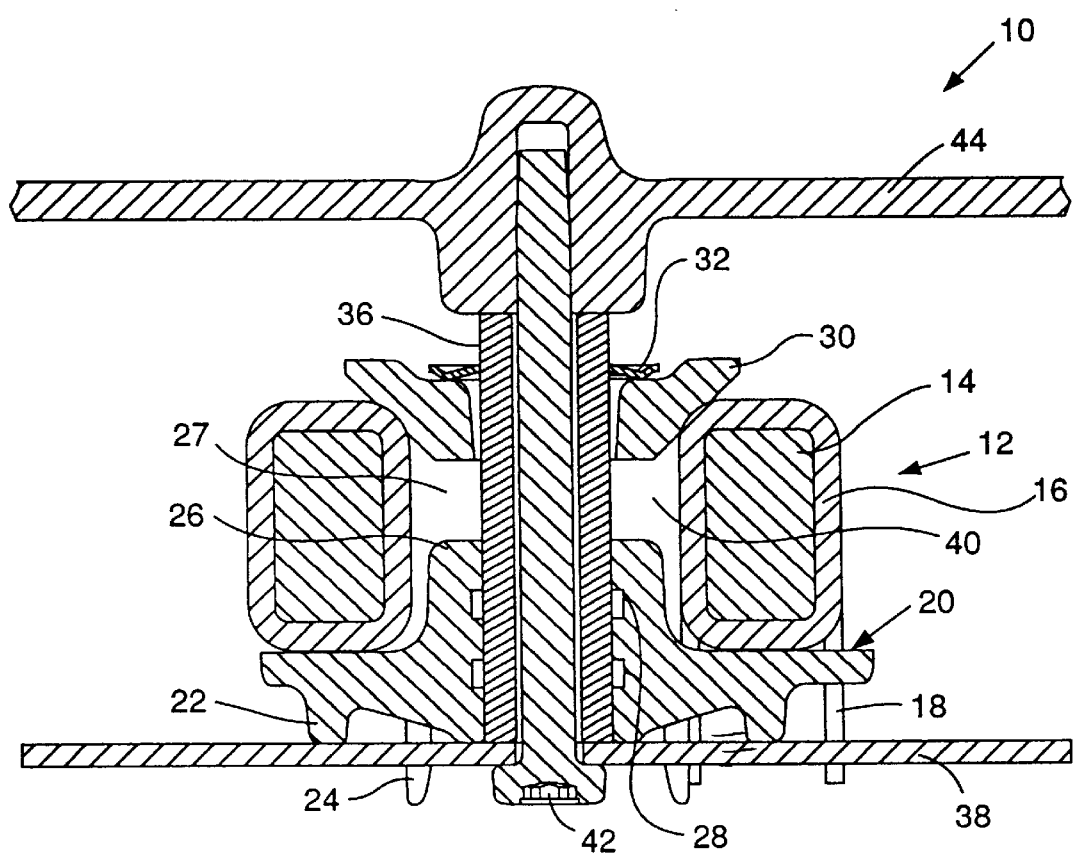
FIG. 2 is a side sectional view of an apparatus for facilitating mounting of an inductor assembly to a printed circuit board.

A spacer assembly 20 is adapted to receive inductor assembly 12. In the preferred embodiment, spacer assembly 20 is substantially annular. As seen in FIG. 2, spacer assembly 20 has a centrally disposed aperture therein, and includes a plurality of levelers 22 connected to the bottom surface thereof. The levelers 22 aid in both keeping spacer assembly 20 stable and substantially parallel to circuit board 38, as will be described in greater detail below. Spacer assembly 20 further includes alignment pins 24 connected to the bottom surface thereof. Alignment pins 24 aid in guiding the placement of spacer assembly 20 on printed circuit board 38, as will be described in greater detail below. Spacer assembly 20 further includes a boss member 26 connected to the top surface thereof for properly seating inductor assembly 12 thereon. As shown in FIG. 2, in the preferred embodiment boss member 26 includes undercuts 28 which promote retention of the boss member 26 to bushing 36.

Referring again to FIG. 2, the apparatus 10 is mounted to circuit board 38, levelers 22 engage the top surface of circuit board 38, keeping spacer assembly substantially parallel to circuit board 38. In addition, alignment pins 24 extend through circuit board 38, thereby maintaining the apparatus 10 in the x-y plane.

Referring back to FIG. 1, in the preferred embodiment, spacer assembly 20 includes alignment apertures 21 therein. Alignment apertures 21 receive leads 18 from inductor assembly 12, such that leads 18 extend through spacer assembly 20, thereby aiding the alignment of the mounting assembly with the circuit board 38. However, it is not necessary for leads 18 to extend through spacer assembly 20. Rather, leads 18 may extend around spacer assembly 20 and into circuit board 38 for electrically connecting inductor assembly 12 to printed circuit board 38 and still fall within the scope of the present invention.

Referring again to FIG. 1, wedge member 30 is provided to evenly distribute a clamping force to the top surface of inductor assembly 12. In the preferred embodiment, wedge member 30 is substantially fructo-conically shaped and has a centrally disposed aperture therein. As such, wedge member 30 engages the top surface of inductor assembly 12, and is partially disposed within the inductor assembly central aperture, thereby forming a chamber 27 between boss member 26 and wedge member 30. In the preferred embodiment, a retaining member 32 is provided to retain wedge member 30 in place, as will be described in greater detail below.

A substantially cylindrical hollow tube or bushing 36 is provided which extends through each of the centrally disposed apertures of the inductor assembly 12, the spacer assembly 20, the retaining member 32, and the wedge member 30. As seen in FIG. 2, bushing 36 communicates with enclosure or housing 44 as follows. In manufacture, a subassembly printed circuit board that is fully functional (e.g. having the apparatus 10 and all other components mounted thereon) is provided. To protect the apparatus 10 from the high vibration environment, a fastener 42, which in the preferred embodiment is a screw, but which may be any fastening device, extends through bushing 36 and into housing 44. The assembly of the apparatus 10 and its subsequent enclosure are described in greater detail below.

Referring back to FIG. 1, in the preferred embodiment, bushing 36 is a metallic cylinder, preferably brass, thereby providing a heat sinking capability. As seen in FIG. 2, bushing 36 communicates with enclosure 44, which in the preferred embodiment is an aluminum die cast housing, thereby transferring heat from inductor assembly 12 to housing 44. The heat sinking capability of bushing 36 allows the use of a less efficient, less costly conductive material for core 14, thereby offering significant cost savings. It will be appreciated by those skilled in the art that in an environment that is not a high temperature environment, bushing 36 may be made of plastic, thereby offering an even further cost savings. It should be noted that the length of bushing 36 must be engineered so that its length is appropriate to account for the z-axis tolerance.

The assembly of the apparatus 10 is more fully understood by reference to FIGS. 1 and 2. Bushing 36 extends through each of the centrally disposed apertures of the inductor assembly 12, the spacer assembly 20, the wedge member 30, and the retaining member 32. In order to overcome inductor shape variation and to provide adequate clamping force, essentially two clamping operations are done. The inductor assembly 12 is first clamped to spacer assembly 20 with wedge member 30. A press via a fixture (not shown) applies force to the wedge member 30 which evenly distributes the force on the top surface of inductor assembly 12, so that retention is force regulated and not influenced by clamp joint thickness (e.g. part tolerances). In the preferred embodiment, a retaining ring 32 is then forced over bushing 36, causing prongs 34 to spread from their initial position to accommodate the shaft of bushing 36. Load applied from the opposite direction causes the prongs 34 to grip the bushing 36 tightly, locking the retaining ring 32 in place, thereby retaining the wedge member 30 and clamping force in place. However, it will be appreciated by those skilled in the art that in an alternate embodiment, a sufficient clamping force may be obtained and retained without the use of retaining ring 32. Once the inductor assembly 12 is clamped to the spacer assembly 20, part placement on the printed circuit board 38 is guided by alignment pins 24 on the lower side of the spacer assembly 20.

After printed circuit board assembly, the printed circuit board assembly is placed into enclosure 44. A simple x/y robot or even hand assembly can be used to position fastener 42. Tightening of fastener 42 with a torque/turn driver is made predictable because bushing 36 is used as the clamp joint. Bushing 36 provides heat transfer to the enclosure 44 to lower inductor assembly operating temperatures. Furthermore, a thermally conductive adhesive compound 40, such as silicon, may be added to the inductor assembly/spacer assembly joint (e.g. disposed within chamber 27) to improve retention of inductor assembly 12 and spacer assembly 20, and to further improve heat transfer.

Industrial Applicability

An electronic engine controls' primary function is to provide a timed energy pulse to open a fuel control actuator. The frequency and magnitude of this pulse determines the controllability of the actuator and hence the performance of the engine. Many engine manufacturers have chosen to increase the operating voltage of those actuators from the 12 volt system voltage to over 100 volts to optimize controllability. This step-up in voltage is accomplished in an electronic control module by several components making up a high voltage supply. One of the main components in the high voltage supply design is an inductor.

Typically, inductor designs are customized to meet individual electrical design characteristics that determine overall shape and size. However, parts typically have dimensional tolerances of ±2 millimeters or more on all features. This shape variation presents a problem with respect to packaging the part into the electronic control module in that the electronic control module must survive the environment that it is mounted in, which in engines typically includes high temperatures and high vibration forces. The present invention provides an apparatus for facilitating mounting of an inductor assembly to a printed circuit board that is easy to assemble into any mounting scheme and which assures that an adequate clamping force to overcome vibration forces is provided.

Thus, while the present invention has been particularly shown and described with reference to the preferred embodiment above, it will be understood by those skilled in the art that various additional embodiments may be contemplated without departing from the spirit and scope of the present invention.

We claim:

1. An apparatus for facilitating mounting of an inductor assembly to a printed circuit board, comprising:

an inductor assembly having a centrally disposed aperture therein;

a spacer assembly adapted to receive said inductor assembly, said spacer assembly having a centrally disposed aperture therein;

a wedge member applying a substantially evenly distributed clamping force substantially to the edge of the centrally disposed aperture of said inductor assembly, said wedge member having a centrally disposed aperture therein;

a thermally conductive adhesive disposed between said wedge member and said spacer assembly for improving retention of said inductor assembly to said spacer assembly and for improving heat transfer; and a bushing extending through each of said centrally disposed apertures, wherein a clamping force being applied to said wedge member and said inductor assembly is clamped and retained by said adhesive to said spacer assembly with sufficient clamping force provided by an interference fit between said wedge member and said bushing, no additional retaining ring or means being used to clamp and retain said inductor assembly to said spacer assembly.

2. An apparatus as recited in claim 1, wherein said inductor assembly comprises a toroid shaped core having windings about a surface thereof, said windings forming lead wires for electrically connecting said inductor assembly to the printed circuit board.

3. An apparatus as recited in claim 2, wherein said spacer assembly includes alignment apertures therein, said lead wires being disposed through respective alignment apertures.

* * * * *